(12) United States Patent
Sample et al.

(10) Patent No.: US 7,398,069 B2
(45) Date of Patent: Jul. 8, 2008

(54) NAVIGATION MORSE DECODE DISPLAY

(75) Inventors: William G. Sample, Paola, KS (US); David L. Biddick, Overland Park, KS (US); Richard Bontrager, Shawnee Mission, KS (US)

(73) Assignee: Honeywell International Inc., Morristown, NJ (US)

( * ) Notice: Subject to any disclaimer, the term of this patent is extended or adjusted under 35 U.S.C. 154(b) by 1459 days.

(21) Appl. No.: 09/902,963

(22) Filed: Jul. 10, 2001

(65) Prior Publication Data

US 2002/0008641 A1   Jan. 24, 2002

Related U.S. Application Data

(60) Provisional application No. 60/217,057, filed on Jul. 10, 2000.

(51) Int. Cl.
*H04B 1/18* (2006.01)
*G08G 1/09* (2006.01)
*H04Q 7/20* (2006.01)
*G05D 1/02* (2006.01)
*G06F 17/10* (2006.01)
*G06G 7/78* (2006.01)

(52) U.S. Cl. .................. 455/158.1; 455/431; 340/905; 701/300

(58) Field of Classification Search .................. 455/431, 455/558, 158.1, 156.1; 340/573.1, 7.25, 340/905; 342/189, 357.07, 399, 443; 701/300
See application file for complete search history.

(56) References Cited

U.S. PATENT DOCUMENTS

| | | | | |
|---|---|---|---|---|
| 3,772,699 A | * | 11/1973 | Romrell | 342/189 |
| 3,790,943 A | * | 2/1974 | Pickles et al. | 342/399 |
| 3,816,833 A | * | 6/1974 | Ryan | 342/443 |
| 4,212,067 A | * | 7/1980 | Henderson | 701/300 |
| 4,621,252 A | * | 11/1986 | Johns et al. | 340/905 |
| 5,039,984 A | * | 8/1991 | Andros et al. | 340/7.25 |
| 5,220,681 A | * | 6/1993 | Belgin | 455/156.1 |
| 5,905,461 A | * | 5/1999 | Neher | 342/357.07 |
| 5,946,635 A | * | 8/1999 | Dominguez | 455/558 |
| 6,282,417 B1 | * | 8/2001 | Ward | 455/431 |
| 6,388,612 B1 | * | 5/2002 | Neher | 342/357.07 |
| 7,012,534 B2 | * | 3/2006 | Chaco | 340/573.1 |

* cited by examiner

*Primary Examiner*—Thjuan K. Addy
(74) *Attorney, Agent, or Firm*—Black Lowe & Graham PLLC

(57) ABSTRACT

A method and device for displaying radio frequency information, including a database of stored radio frequency identifiers and radio frequency information corresponding thereto, and a processor coupled to the database and operating one or more algorithms for generating a display signal as a function of a correspondence between a decoded radio frequency identifier and one of the stored radio frequency identifiers.

41 Claims, 5 Drawing Sheets

NAVIGATION MORSE DECODE DISPLAY

This application claims the benefit of U.S. Provisional Application Ser. No. 60/217,057, filed in the names of William G. Sample, David L. Biddick, and Richard Bontrager on Jul. 10, 2000, the complete disclosure of which is incorporated herein by reference.

FIELD OF THE INVENTION

The present invention is directed to communication and navigation devices for aircraft and, more particularly, to an aircraft communication and navigation device that decodes a Morse code, correlates the decoded Morse code to a known station, and displays the station information on a cockpit display.

BACKGROUND OF THE INVENTION

Modern aircraft pilots must send and receive information to and from a large number of facilities. In particular, VHF radio signals are used by aircraft pilots for navigation. For example, VOR's (VHF Omni-directional ranges), localizers, LDA's, and SDF's are VHF radio signals that operate within the 108.00 to 117.95 MHz frequency band and have a power output necessary to provide coverage within an assigned operational service volume. The VHF navigation facilities that generate the VHF radio signals are subject to line-of-sight restrictions, and the range varies proportionally to the altitude of the receiving equipment.

Aircraft pilots are instructed to listen to the Morse Code identification of radio navigation stations to verify the correct VHF navigation facility has been tuned and that it is sending valid information. Most VOR facilities are equipped for voice transmission on the VOR frequency. VOR facilities without voice capability are indicated on navigation charts by an underline of the facility frequency. The voice capability may be used for two way communication with aircraft, for transmission of recorded flight information and for voice identification of the navigation station. Many Flight Service Stations (FSS) (or approach control facility) remotely operate several omniranges with different names. In some cases, none of the VOR facilities have the name of the "parent" FSS. Therefore, reliance on voice transmissions by the FSS involved for determining the identification of an omnirange is risky. During periods of maintenance, the facility may radiate a T-E-S-T code (- • •••-) or the code may be removed. The only positive method of identifying a VHF navigation facility is by decoding its Morse code identifier or monitoring the voice identification.

During operation of the aircraft, the pilot must identify the VHF navigation facility by mentally decoding an audio Morse code signal transmitted by the facility. Many pilots are not adept at performing this decoding operation, which often has to be performed during a high workload phase of flight. A single check, by the pilot, of the code at first use of the facility is not sufficient to detect a problem later in the flight. Continuos monitoring is necessary for the highest level of safety.

Systems that provide a radio Morse code identification function are in use and display the identification information in monochrome displays. While useful, such systems have limited functionality. Known Morse code identification systems typically sample the VHF navigation identifier at least twice to increase confidence of a correct decode. This increases the time before the identifier may be displayed to the pilot. Also, known Morse code identification systems do not correlate the decoded Morse code identifier with a specific VHF navigation facility, instead known systems only display a visual representation of the Morse code itself. When unable to decode the Morse signal, existing systems merely "dash" the display. These limitations increase the pilot's workload, and detract from safe aircraft operation and navigation.

SUMMARY OF THE INVENTION

The present invention overcomes the limitations of the prior art by providing a device in the cockpit that reduces pilot workload by automating decoding of the Morse code identifier and using an onboard database to correlate the decoded Morse code identifier with a specific VHF navigation facility.

The present invention also provides continuous monitoring, in contrast to prior art systems that rely on a single check by the pilot.

The development of inexpensive large format color displays and inexpensive memory for information storage make practicing the present invention feasible for aircraft. One embodiment of the present invention is sized for installation and operation in small business and general aviation aircraft.

The present invention provides a display device that includes a display having a first input structured to receive a radio frequency control signal and a second input coupled to receive radio frequency information, the display structured to display one of the radio frequency information and caution information in response to a signal received on a third input; a radio receiver having a first input coupled to receive the radio frequency control signal and a second input coupled to receive a radio frequency signal having an identifier coded in Morse code, the radio receiver outputting the coded identifier; a memory device having a first input coupled to receive the radio frequency control signal and a second input coupled to receive a position signal, the memory device having a circuit for correlating the radio frequency control signal and the position signal with a database of radio frequency identifiers to select and output on a first output one of the radio frequency identifiers and to select and output on a second output coupled to the second input of the display radio frequency information corresponding to the selected one of the radio frequency identifiers; and a processor having a first input coupled to receive the output of the radio receiver to receive the coded identifier and a second input coupled to the output of the memory device to receive the selected one of the radio frequency identifiers, the processor operating one or more algorithms for decoding the coded identifier, for comparing the decoded identifier with the selected one of the radio frequency identifiers, and for generating a signal on an output coupled to the third input of the display as a function of the comparing.

The display of the display device is structured to display the radio frequency information corresponding to the selected one of the radio frequency identifiers in response to the signal indicative of a correspondence between the decoded identifier and the selected one of the radio frequency identifiers.

The display of the display device is also structured to display caution information in response to the signal indicative of a divergence between the decoded identifier and the selected one of the radio frequency identifiers.

The device also includes a radio frequency input device coupled to the first input of the display for inputting the radio frequency control signal.

The invention also provides methods of accomplishing the same.

According to another aspect of the invention, a decoder is provided operating an algorithm for decoding a radio signal identifier, or identification string, in a Morse coded radio frequency signal, the decoder including a down-sampler quadrature filter bank coupled to receive a detected Morse radio frequency signal having a coded identifier and structured to convert a received signal into an in-phase signal and a quadrature-phase signal and reduce the sampling frequency to a predetermined level; a pair of down-sampler/multi-stage modulated filter banks coupled to the down-sampler quadrature filter bank and structured to filter respective in-phase and quadrature signals into a predetermined plurality of filter components and to further reduce the sampling frequency; a confidence presence detector coupled to the pair of down-sampler/multi-stage modulated filter banks and structured to search across the plurality of filter components to predict which of the filter banks contains an identification string of a detected radio signal; a viterbi most-likely sequence estimator coupled to the presence detector and structured to operate a most-likely sequence estimator on outputs of the presence detector; and a Morse symbol decoder coupled to the viterbi most-likely sequence estimator and structured to convert a series of 1's and 0's into an estimate of dot, dash, space and word locations in a detected signal.

According to another aspect of the invention, the decoder of the invention is provided in combination with the display device of the invention.

According to yet other aspects of the invention, the invention provides a method or algorithm for decoding a radio signal identifier, or identification string, in a Morse coded radio frequency signal using, for example, the decoder of the invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is a device that receives a Morse code signal from a radio navigation station, decodes the signal, and correlates the decoded signal to a known station, the information for which is stored in an onboard database. The station information is displayed on a cockpit color display.

The present invention integrates a navigational database and a real time digital decoder to process navigation radio Morse code information. The device automates the decoding process, such that no explicit actions are required to enable device operation. The simple tuning of a radio frequency causes a database search for the most likely identifier based upon the current aircraft location.

Figure 1:
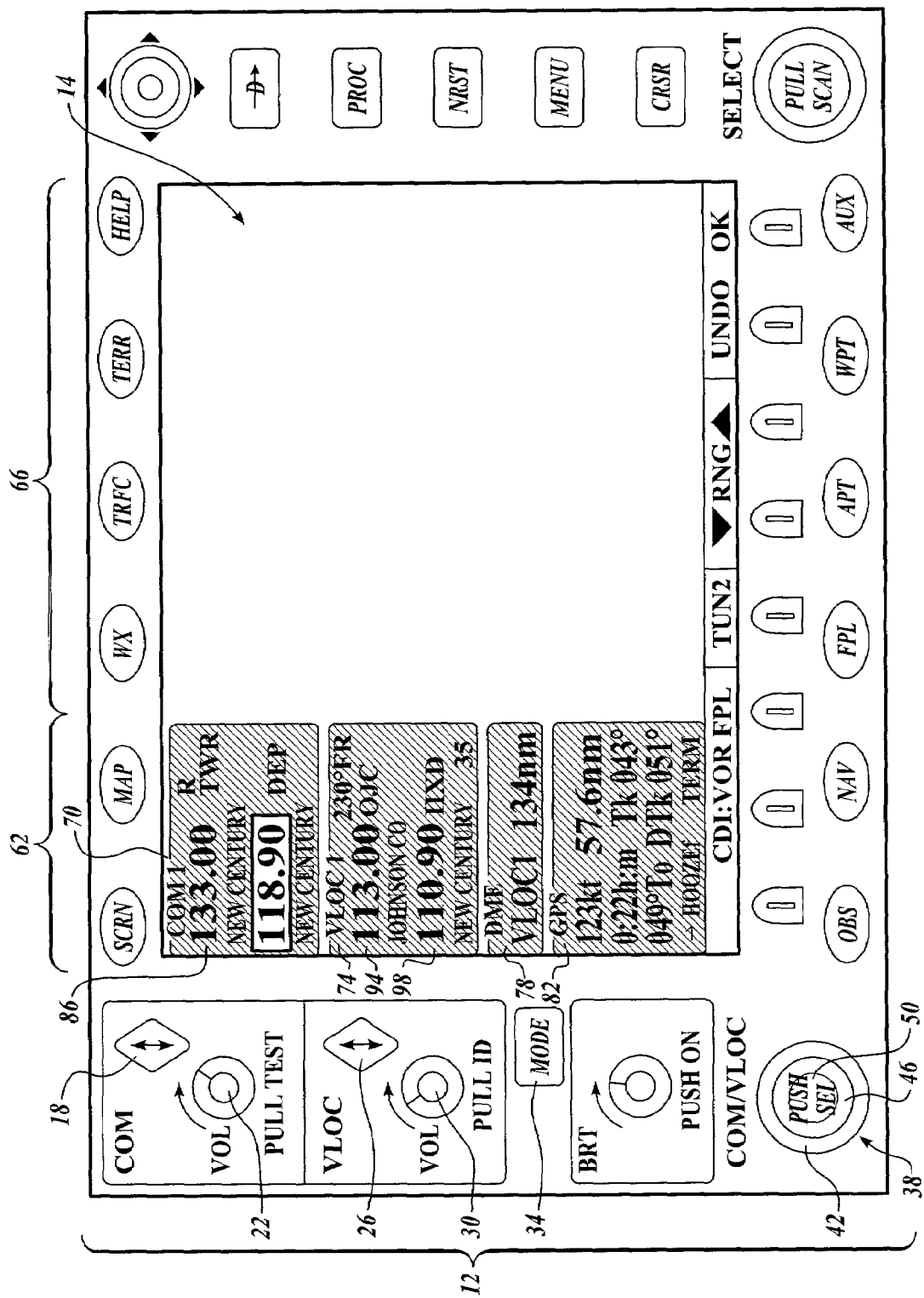
FIG. 1 shows a particular embodiment of a front face of a navcomm device whereupon a Morse code identifier is displayed after it is decoded and correlated with a specific VHF navigation facility using an onboard database.

FIG. 1 shows a particular embodiment of a front face of a navcomm device 10 whereupon a Morse code identifier is displayed after it is decoded and correlated with a specific VOR facility using an onboard database. The navcomm device 10 includes a control panel 12 and a display 14. The control panel 12 includes a VOR localizer (VLOC) frequency transfer switch 26, and a VLOC volume/ID control 30 for controlling volume. The control panel 12 also includes other controls that are well-known, but are not relevant to the present invention and are not described.

Display 14 includes a left side display portion 62 on which the displays of navigation frequency identification of the invention are provided. Display 14 also includes a right side display portion 66 having displays that are not relevant to the present invention and are not described. The contents of the left side display portion 62 depends upon the set display mode for navcomm device 10. The display modes relevant to this invention include a standby frequency entry mode and an active frequency entry mode. These different display modes will be discussed in more detail below.

The left side display portion 62 includes a COM frequency display 70, a VLOC frequency display 74, a distance measuring equipment (DME) display 78, and a GPS display 82. The COM frequency display 70, DME display 78, and GPS display 82 are not relevant to the present invention and are not described.

The VLOC frequency display 74 typically displays an active VLOC frequency 94 (shown as 113.00 in this example) and a standby VLOC frequency 98. Indicated together with the active VLOC frequency 94 is the station identifier (OJC in this example) to the right of the frequency, the direction (230° in this example) to or from (FR in this example) the facility above the VOR station identifier, and the facility name (Johnson Co) below the frequency. Indicated together with the standby VLOC frequency 98 is the station identifier (IIXD in this example) to the right of the frequency and the facility name (New Century) below the frequency.

A concentric control device 38 whereby the pilot enters a VLOC frequency 94. The concentric control device 38 has a rotatable outer knob 42, a rotatable inner knob 46 and a centrally disposed push button 50. The standby VLOC frequency 98 is set using the concentric control device 38. A megahertz portion of the standby VLOC frequency 98 is set between 108 and 117 by rotating outer knob 42, and the kilohertz portion of the standby VLOC frequency 98 is set between 00 and 95 by rotating inner knob 46 of concentric control device 38, so that the standby VLOC frequency 98 is set within the 108.00 to 117.95 MHz frequency band. The pilot selects a standby VLOC frequency 98 that matches the desired VOR facility indicated on the navigation chart. The VLOC frequency transfer switch 26 transfers the standby VLOC frequency 98 to the active VLOC frequency 94 so that the navigation receiver (shown in FIG. 2) can receive on the VLOC frequency 94.

The Morse code navigation signal from a radio navigation station operating on the VLOC frequency 94 is received, decoded, and correlated to a known VHF navigation station, the information for which is stored in an onboard database. The VHF navigation station information is then displayed on a cockpit color display.

Figure 2:
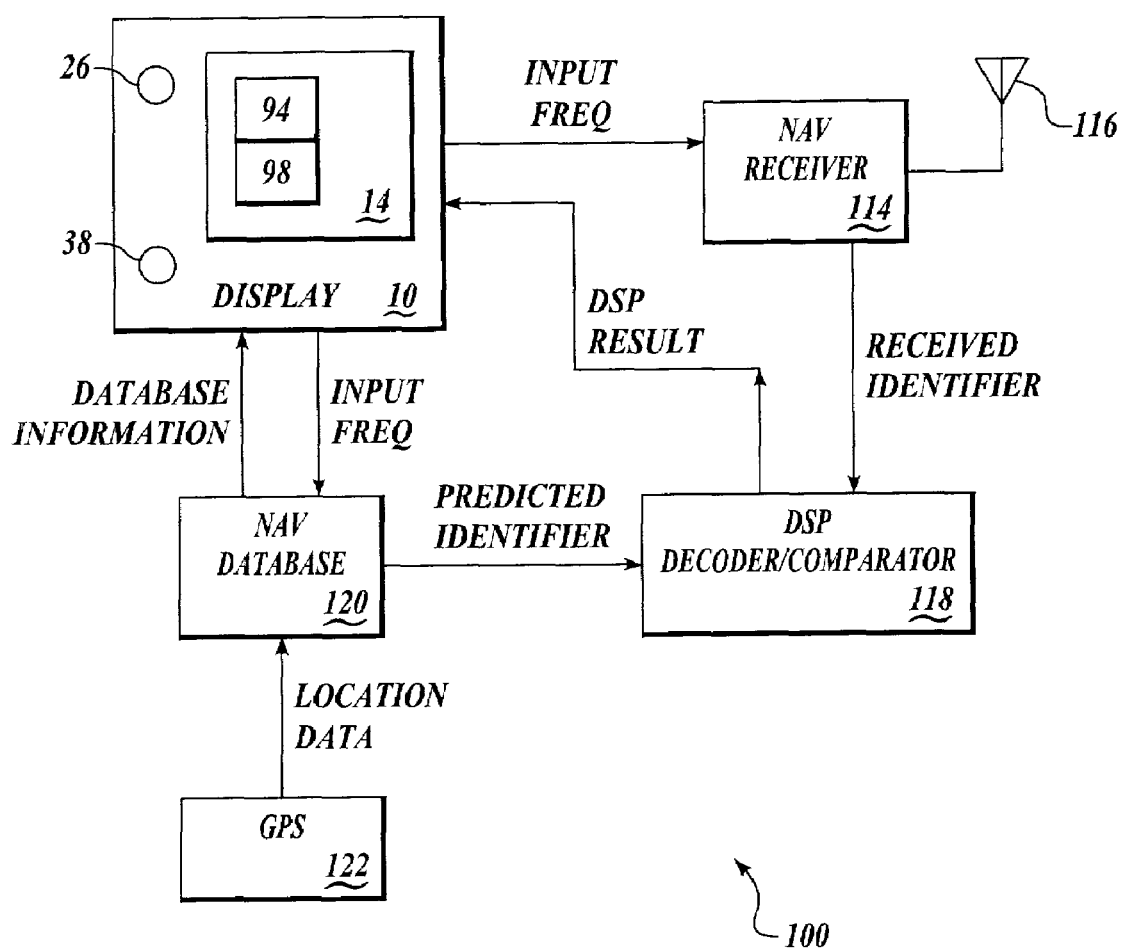
FIG. 2 illustrates an exemplary block diagram of one embodiment of the Morse signal decoder and identifier device of the invention.

FIG. 2 illustrates an exemplary block diagram of one embodiment of he Morse code decoder and identifier device 100 of the invention. The Morse code decoder and identifier of the invention can be implemented in any number of configurations, and the block diagram of FIG. 2 is only one exemplary embodiment, which is not intended to in any way limit the scope of the invention or its equivalents.

Figure 3:
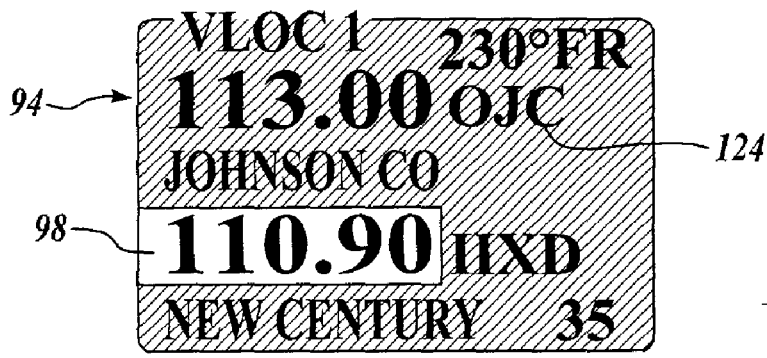
FIG. 3 is an exemplary display of navigation frequency identification before successful Morse decoding.

In FIG. 2, the radio frequency of a desired VHF radio navigation station navigation station, for example a VOR station, is entered on the navcomm device 10 using the outer knob 42 and the inner knob 46 of the concentric control device 38 to tune the standby VLOC frequency 98 at the frequency indicated on the navigation chart. The standby VLOC frequency 98 is displayed on the display 14, as shown in FIG. 3. At an appropriate time, the pilot transfers the standby VLOC frequency 98 to the active VLOC frequency 94 using the VLOC frequency transfer switch 26. The VLOC frequency 98 is simultaneously input to the navigation receiver 114, which begins to receive the VHF navigation signal via the antenna 1116. The VHF navigation signal is received in Morse code and input to a processor 118, such as a digital signal processor, which operates an algorithm, described below, that decodes the received Morse code identifier in a single pass. The processor 118 is alternatively a dedicated processor or another processor located elsewhere in the aircraft, which may be shared by other functions.

The frequency of the desired VOR station is also input to a lookup table of VHF navigation stations stored in an onboard memory device as a navigation database 120. Current aircraft location data is retrieved from an onboard global positioning system (GPS) 122. The database is searched, and the most likely identifier is predicted based upon the current aircraft location. For example, using both the input frequency and the GPS location data, the identifier of the VOR facility closest to the aircraft's present location is located in the navigation database 120 using the input frequency. The "predicted" identifier is passed to the digital signal processor 118, and the information from the navigation database 120 is displayed near the entered frequency, as shown in FIG. 3.

The algorithm operated on the digital signal processor 118 compares the decoded identifier received over the navigation receiver 114 with the identifier predicted by the navigation database 120. The algorithm operated on the digital signal processor 118 identifies one of the following conditions: (1) the identifier received from the navigation station corresponds to and is the predicted identifier; (2) no identifier is currently being received from the navigation station; and (3) an identifier which does not correspond to and is not the predicted identifier was received from the navigation station.

FIG. 3 is an exemplary illustration of the display 14 showing navigation frequency identification information before the Morse signal is successfully decoded. The navigation frequency identification information 124 from the navigation database 120 is displayed near the entered frequency, as shown in FIG. 3, in the same color as the active VLOC frequency 94, for example, white.

Figure 4:
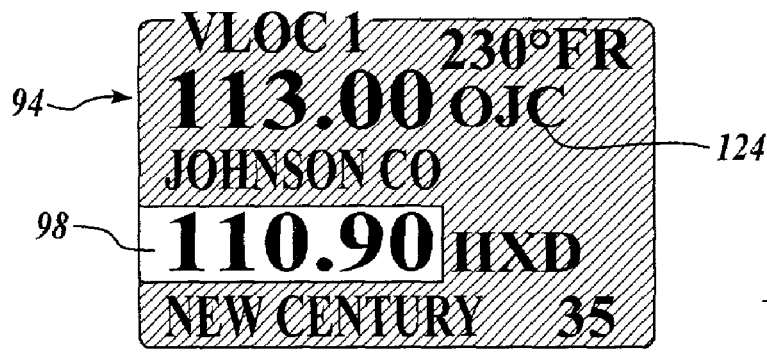
FIG. 4 is an exemplary display of navigation frequency identification illustrating the display following successful Morse decoding wherein the decoded Morse identifier matches the database identifier.

As shown in FIG. 4, after the Morse code identifier is successfully decoded, it is compared with the predicted identifier from the navigation database 120. If the received and predicted identifiers match, the identifier 124 displayed on the display 14 changes to a different color, such as green (not shown), that indicates a successful match.

Figure 5:
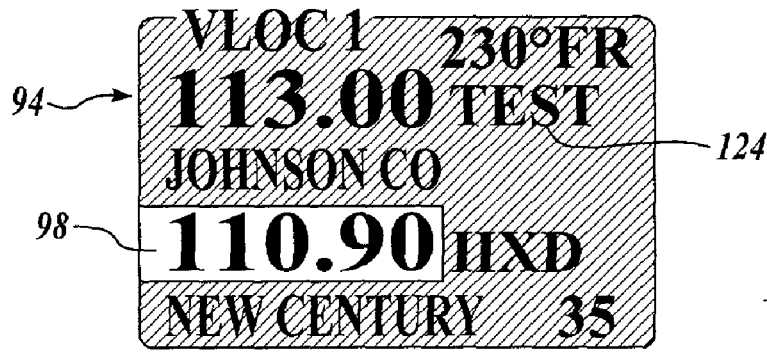
FIG. 5 is an exemplary display of navigation frequency identification illustrating the display following successful Morse decoding wherein the decoded Morse identifier does not match the database identifier.

As shown in FIG. 5, if the decoded identifier does not match the predicted identifier from the navigation database 120, then the decoded identifier is displayed as the identifier 124 in a color, such as yellow (not shown), that conveys caution or warning.

Figure 6:
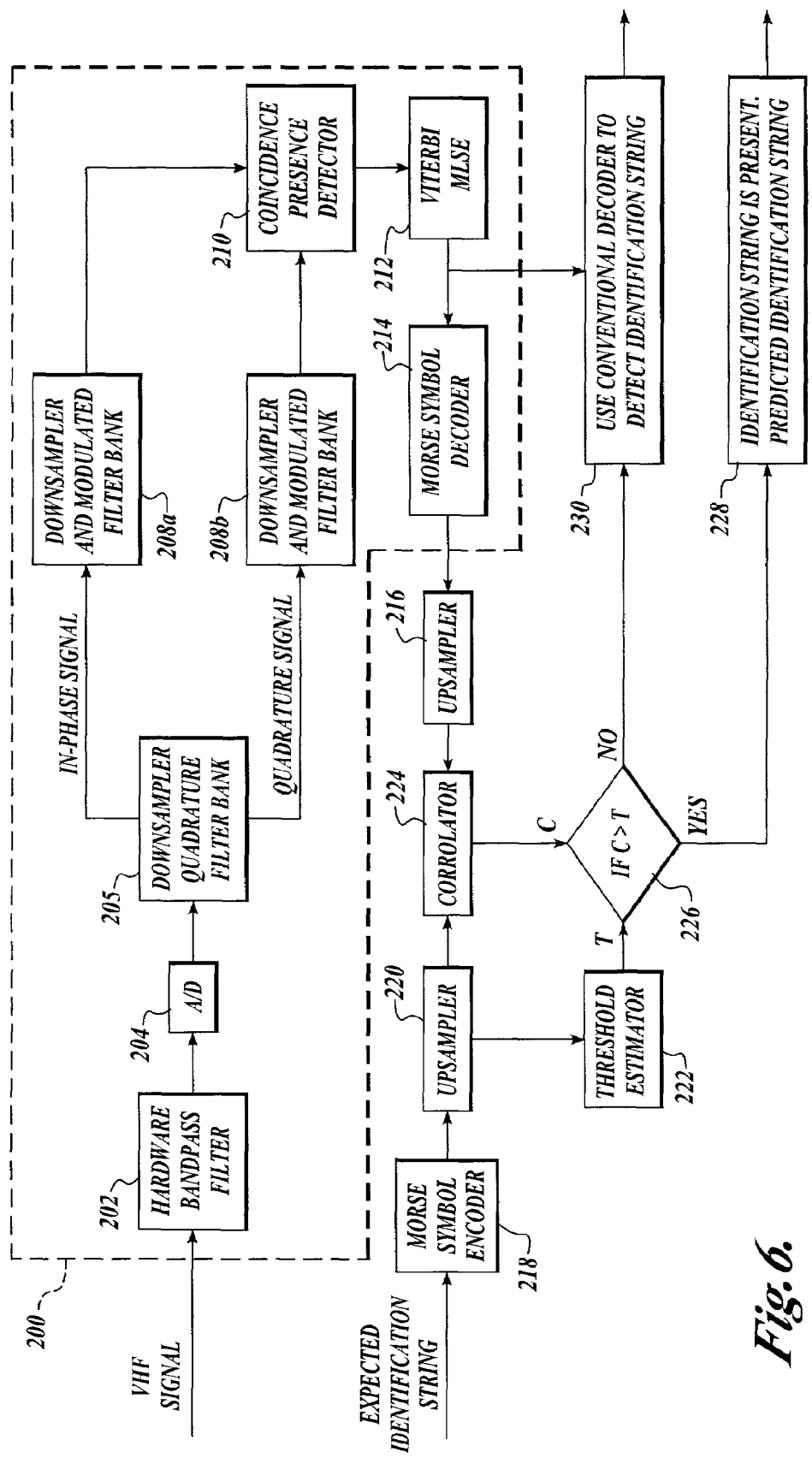
FIG. 6 is a flow chart that illustrates one embodiment for implementing in a processor the algorithm of the invention for decoding in a single pass the identification string in a received Morse code radio frequency signal.

FIG. 6 is a flow chart that illustrates one embodiment for implementing in a processor 118 (shown in FIG. 2) the algorithm of the invention that decodes the received Morse code identifier in a single pass. Of course, the algorithm of the invention is alternatively implemented by other equivalent means. The flow chart illustrated in FIG. 6 is thus only one exemplary embodiment of the algorithm of the invention and is not intended to in any way limit the scope of the invention.

In FIG. 6, the VHF radio frequency signal detected at the navigation receiver 114 via the antenna 116 and provided to the processor 118, which operates a Morse radio frequency signal identifier decoder 200 of the invention for decoding the detected Morse code identifier in a single pass. The detected VHF radio frequency signal is processed by a hardware bandpass filter 202, which is the hardware anti-alias filters and baseband decoding hardware for the decoder 200. The signal is analog-to-digital converted in a A/D (analog-to-digital) converter 204 operating at a suitable frequency, for example 3120 Hz.

The digital signal is passed to a 26-times down-sampler quadrature filter bank 206 that converts the received signals into an in-phase and quadrature-phase signal, and reduces the sampling frequency to a more suitable level. For example, the 26-times down-sampler quadrature filter bank 206 reduces the sampling frequency from 3120 Hz to 120 Hz. The in-phase signal and quadrature signal are passed to respective down-sampler/multi-stage modulated filter bank 208a, 208b, that filters each of the respective in-phase and quadrature signals into multiple components and further reduces the sampling frequency. For example, the down-sampler is a 6-times down-sampler that reduces the sampling frequency from 120 Hz to 20 Hz, and the multi-stage modulated filter bank is an 8-stage modulated filter bank.

The in-phase and quadrature signals are passed to confidence presence detector 210 that searches across the plurality of filter components to determine which bank is likely to contain the identification string, i.e., the VHF radio frequency identifier. The presence detector 210 makes this determination by determining which signal has the most energy. The presence detector 210 creates a multi-level confidence indicator by comparing the most likely signal energy with the average energy in all the remaining filter stages. For example, the presence detector 210 is a 4-bit confidence presence detector 210 that determines which bank is likely to contain the identification string by searching across the eight filter components to determine which signal has the most energy, and then creates a 16-level confidence indicator by comparing the most likely signal energy with the average energy in all the remaining filter stages.

Figure 7:
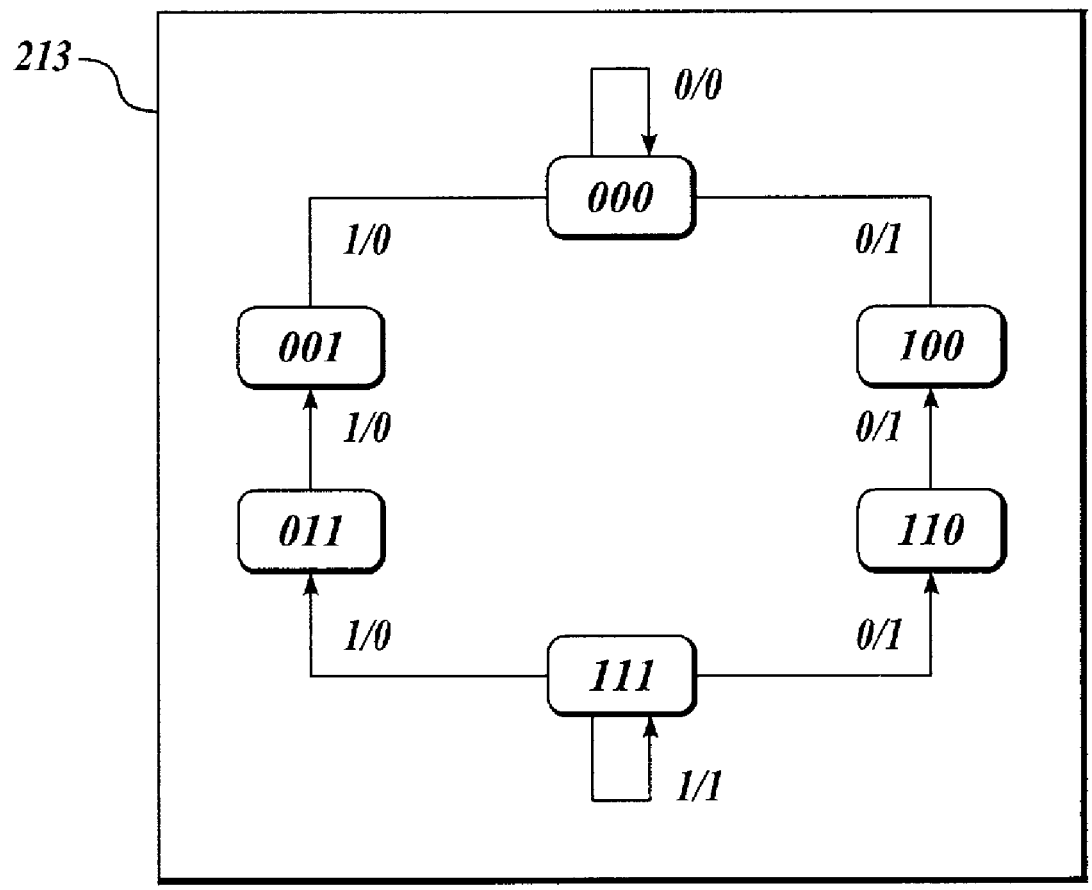
FIG. 7 illustrates a state chart used by a viterbi MSLE in the operation of a viterbi most-likely sequence estimator on the outputs of a presence detector during operation of the algorithm of the invention illustrated in FIG. 6.

A viterbi MSLE 212 operates a viterbi most-likely sequence estimator on the outputs of the presence detector 210 using the state chart 213 shown in FIG. 7.

A Morse symbol decoder 214 receives the output of the viterbi MSLE 212, converts the series of 1's and 0's into an estimate of the dot, dash, space and word locations in the detected signal, and outputs the result to an up-sampler 216 that converts the detected word into a series of 1's and 0's having a predetermined width of 1's per dot length. For example, the up-sampler 216 is a 3-times up-sampler that converts the detected word into a series of 1's and 0's whose width is three ones per dot length.

The navigation database 120 outputs the identification string of the predicted identifier of the desired VHF radio navigation station, for example a desired VOR station, to the processor 118. A Morse symbol encoder 218 encodes the predicted identification string into a series of dot, dash, space and word symbols. The encoded predicted identification string is operated upon by an up-sampler 220 that convert the detected word into a series of 1's and 0's having a predetermined width of 1's per dot length. For example, the up-sampler 220 is a 3-times up-sampler that converts the detected word into a series of 1's and 0's whose width is three ones per dot length.

A threshold estimator 222 estimates the signal energy in the encoded and up-sampled predicted identification string.

A correlator 224 correlates the detected and up-sampled Morse code symbols with the predicted Morse code symbols to determine whether the detected VHF radio frequency signal identifier corresponds to the predicted identifier. If a comparator 226 determines that the signal energy in the detected VHF radio frequency signal identifier exceeds the threshold estimate of the signal energy in the predicted identification string, then a VHF radio frequency signal identifier has been detected and the detected VHF radio frequency signal identifier corresponds to the predicted identifier, as shown in block 228. Given such positive identification, the result is transmitted to the navcomm device 10, and displayed on the front face thereof, as discussed above. The pilot is thus informed that the desired VHF radio navigation station has been detected.

If the comparator 226 determines that the signal energy in the detected VHF radio frequency signal identifier is less than the threshold estimate of the signal energy in the predicted identification string, then either a VHF radio frequency signal identifier has not been detected, or the detected VHF radio frequency signal identifier fails to corresponds to the predicted identifier. As shown in block 230, given such negative identification, the output of the viterbi MSLE 212 is output to a conventional Morse signal decoder (not shown) that uses the results of the Viterbi MLSE to attempt via time correlation to decode the detected identification string.

While the preferred embodiment of the invention has been illustrated and described, it will be appreciated that various changes can be made therein without departing from the spirit and scope of the invention.

What is claimed is:

1. A device, comprising:
   a database of stored radio frequency identifiers and radio frequency information corresponding thereto; and
   a processor coupled to the database and operating one or more algorithms for comparing a decoded radio frequency identifier and a comparison radio frequency identifier selected from the stored radio frequency identifiers in the database and for generating a display signal based on the comparison;
   wherein the database of stored radio frequency identifiers is accessed as a function of a radio frequency signal and a position signal indicative of a location of the device, and the display signal is one of a signal indicative of a correspondence and a divergence between the decoded radio frequency identifier and the comparison radio frequency identifier, and
   wherein the display signal that identifies that the decoded radio frequency signal identifier diverging from the comparison radio frequency identifier further identifies one of that a radio frequency signal identifier was not decoded, and that the decoded radio frequency signal identifier does not correspond to the comparison radio frequency identifier; and
   a display coupled to the processor and the database, the display structured to display the radio frequency information in response to the display signal indicative of a correspondence between the decoded radio frequency identifier and the comparison radio frequency identifier, the display further structured to display caution information in response to the display signal indicative of a divergence between the decoded radio frequency identifier and the stored radio frequency identifier.

2. The device recited in claim 1, further comprising a memory device having the database stored therein.

3. The device recited in claim 1 wherein the one or more algorithms operated by processor includes one or more algorithms for generating the decoded radio frequency identifier by decoding a coded radio frequency identifier.

4. The device recited in claim 3 wherein the coded radio frequency identifier is coded in Morse.

5. A device, comprising:
   a means for storing radio frequency information as a function of different radio frequency identifiers;
   a means for interrogating the storing means as a function of a predetermined radio frequency and a current position of the device to select one of the stored radio frequency identifiers;
   a means for comparing a decoded radio frequency identifier and the selected one of the stored radio frequency identifiers;
   a means for generating a comparison signal as a function of the comparing the decoded radio frequency identifier and the selected one of the stored radio frequency identifiers,
   wherein the comparison signal is a signal that identifies one of
       the decoded radio frequency signal identifier corresponding to the selected one of the stored radio frequency identifiers, and the decoded radio frequency signal identifier diverging from the selected one of the stored radio frequency identifiers, and
   wherein the comparison signal further identifies one of that a radio frequency signal identifier was not decoded, and that the decoded radio frequency signal identifier does not correspond to the selected one of the stored radio frequency identifiers;
   means for interrogating the storing means as a function of the predetermined radio frequency to select radio frequency information; and
   means for displaying the selected radio frequency information, including one of the selected radio frequency information and warning information as a function of the comparison signal.

6. The device recited in claim 5 wherein the means for interrogating the storing means as a function of the predetermined radio frequency to select radio frequency information includes means for interrogating the storing means as a function of a position signal to select the radio frequency information.

7. The device recited in claim 5, further comprising means for decoding a coded radio frequency signal identifier to determine the decoded radio frequency identifier.

8. The device recited in claim 7 wherein the coded radio frequency signal identifier is coded in Morse.

9. The device recited in claim 5 wherein the means for interrogating the storing means as a function of a predetermined radio frequency to select one of the stored radio frequency identifiers includes means for interrogating the storing means as a function of a position signal.

10. The device recited in claim 9, wherein the means for displaying the selected radio frequency information includes displaying the selected radio frequency information as a function of the comparison signal.

11. A display device, comprising:
a display having a first input structured to receive a radio frequency control signal and a second input coupled to receive radio frequency information, the display structured to display one of the radio frequency information and caution information in response to a signal received on a third input;
a radio receiver having a first input coupled to receive the radio frequency control signal and a second input coupled to receive a radio frequency signal having an identifier coded in Morse code, the radio receiver outputting the coded identifier;
a memory device having a first input coupled to receive the radio frequency control signal and a second input coupled to receive a position signal, the memory device having a circuit for correlating the radio frequency control signal and the position signal with a database of radio frequency identifiers to select and output on a first output one of the radio frequency identifiers and to select and output on a second output coupled to the second input of the display radio frequency information corresponding to the selected one of the radio frequency identifiers; and
a processor having a first input coupled to receive the output of the radio receiver to receive the coded identifier and a second input coupled to the output of the memory device to receive the selected one of the radio frequency identifiers, the processor operating one or more algorithms for decoding the coded identifier, for comparing the decoded identifier with the selected one of the radio frequency identifiers, and for generating a signal on an output coupled to the third input of the display as a function of the comparing, wherein the signal generated by the processor as a function of the comparing the decoded identifier with the selected one of the radio frequency identifiers is one of
a signal indicative of a correspondence and a divergence between the decoded identifier and the selected one of the radio frequency identifiers,
wherein the signal is a signal that identifies one of
the decoded identifier corresponding to the selected one of the radio frequency identifiers, and the decoded identifier diverging from the selected one of the radio frequency identifiers, and
wherein the signal further identifies one of
that an identifier was not decoded, and that the decoded identifier does not correspond to the selected one of the radio frequency identifiers, and
wherein the display is structured to display caution information in response to the signal indicative of a divergence between the decoded identifier and the selected one of the radio frequency identifiers.

12. The device recited in claim 11 wherein the display is structured to display the radio frequency information corresponding to the selected one of the radio frequency identifiers in response to the signal indicative of a correspondence between the decoded identifier and the selected one of the radio frequency identifiers.

13. The device recited in claim 11, further comprising a radio frequency input device coupled to the first input of the display for inputting the radio frequency control signal.

14. A method for displaying a radio frequency identifier, comprising:
receiving a radio frequency control signal indicating a radio frequency;
receiving a radio frequency signal corresponding to the indicated radio frequency;
locating in an onboard database database information corresponding to a facility closest to a present position of an aircraft using the indicated radio frequency;
locating in the onboard database database information corresponding to the closest facility;
displaying the located database information;
determining a correspondence between the database information and the received radio frequency signal;
generating a signal as a function of the correspondence between the database information and the received radio frequency signal,
wherein the signal is a signal that identifies one of
the received radio frequency signal corresponding to the database information, and the received radio frequency signal diverging from the database information, and
wherein the signal farther identifies one of that a radio frequency signal was not received, and that the received radio
frequency signal does not correspond to the database information; and
altering one or more of a color and a text of the displayed database information in response to the generated signal.

15. The method recited in claim 14, farther comprising entering the radio frequency control signal.

16. The method recited in claim 14 wherein: the received radio frequency signal is a coded signal; and further comprising decoding the coded signal.

17. A method for controlling the display of information, composing:
receiving a decoded coded signal from a radio navigation station;
correlating the decoded signal to a known radio navigation station to produce a correlation signal;
identifying one of the decoded signal corresponding to the known radio navigation station, and the decoded signal diverging from the known radio navigation station;
identifying one of that a signal was not decoded, and that the decoded signal does not correspond to the known radio navigation station;
retrieving information corresponding to the known radio navigation station from a database of stored information;
making the retrieved information available on an output from the database;
displaying the retrieved information; and
altering the displayed information as a function of the correlation signal, including altering the displayed information to indicate one of a positive correlation and a negative correlation.

18. The method recited in claim 17 wherein correlating the decoded signal to a known radio navigation station includes correlating the decoded signal as a function of a current position signal.

19. The method recited in claim 17 wherein displaying the retrieved information includes displaying the retrieved information on a color display.

20. The method recited in claim 17 further comprising decoding the coded signal.

21. The method recited in claim 20 wherein the coded signal is coded in Morse.

22. A method controlling the display of information, comprising:
  storing radio frequency information as a function of different radio frequency identifiers;
  interrogating the stored radio frequency information as a function of a predetermined radio frequency and a positional signal to select one of the stored radio frequency identifiers;
  comparing a decoded radio frequency identifier and the selected one of the stored radio frequency identifiers;
  generating a comparison signal as a function of the comparing the decoded radio frequency identifier and the selected one of the stored radio frequency identifiers ;
  interrogating the stored radio frequency information as a function of the predetermined radio frequency to select radio frequency information;
  identifying one of the decoded radio frequency identifier corresponding to the selected one of the stored radio freciuency identifiers, and the decoded radio freciuency identifier diverging from the selected one of the stored radio freciuency identifiers, and
  identifying one of that a radio frequency identifier was not decoded, and that the decoded radio frequency identifier does not correspond to the selected one of the stored radio frequency identifiers; and
  displaying selected radio frequency information or warning information as a function of the comparison signal.

23. The method recited in claim 22 wherein interrogating the stored radio frequency information as a function of the predetermined radio frequency to select radio frequency information includes interrogating the stored radio frequency information as a function of a position signal to select the radio frequency information.

24. The method recited in claim 22, further comprising decoding a coded radio frequency signal identifier to determine the decoded radio frequency identifier.

25. The method recited in claim 22 wherein the coded radio frequency signal identifier is coded in Morse.

26. The method recited in claim 22 wherein interrogating the stored radio frequency information as a function of a predetermined radio frequency to select one of the stored radio frequency identifiers includes interrogating the stored radio frequency information as a function of a position signal.

27. The method recited in claim 26, further comprising displaying the selected radio frequency information as a function of the comparison signal.

28. A Morse radio frequency signal identifier decoder, comprising:
  a down-sampler quadrature filter bank coupled to receive a detected Morse radio frequency signal having a coded identifier and structured to convert a received signal into an in-phase signal and a quadrature-phase signal and reduce the sampling frequency to a predetermined level;
  a pair of down-sampler/multi-stage modulated filter banks coupled to the down-sampler quadrature filter bank and structured to filter respective in-phase and quadrature signals into a predetermined plurality of filter components and to further reduce the sampling frequency;
  a confidence presence detector coupled to the pair of down-sampler/multi-stage modulated filter banks and structured to search across the plurality of filter components to predict which of the filter banks contains an identification string of a detected radio signal;
  a viterbi most-likely sequence estimator coupled to the presence detector and structured to operate a most-likely sequence estimator on outputs of the presence detector; and
  a Morse symbol decoder coupled to the viterbi most-likely sequence estimator and structured to convert a series of 1's and 0's into an estimate of dot, dash, space and word locations in a detected signal;
  a correlator circuit receiving an output of the Morse symbol decoder and a predicted Morse code radio frequency identifier, the correlator circuit structured to correlate the output of the Morse symbol decoder with the predicted Morse code radio frequency identifier to determine whether the detected VHF radio frequency signal identifier corresponds to the predicted identifier;
  a threshold estimator circuit coupled to receive the predicted Morse code radio frequency identifier and structured to estimate a signal energy in the predicted Morse code radio frequency identifier;
  a comparator coupled to receive the respective outputs of the correlator circuit and the threshold estimator circuit and structured to determine the signal energy in a detected Morse radio frequency signal identifier relative to the threshold estimate of the signal energy in the predicted Morse code radio frequency identifier;
  a circuit structured to generate a display signal as a function of a determination of the signal energy in the detected Morse radio frequency signal identifier relative to the threshold estimate of the signal energy in the predicted Morse code radio frequency identifier,
    wherein the display signal is a signal that identifies one of the detected Morse radio frequency signal identifier corresponding to the predicted Morse code radio frequency identifier, and the detected Morse radio frequency signal identifier diverging from the predicted Morse code radio frequency identifier, and
    wherein the display signal that identifies that the detected Morse radio frequency signal identifier diverging from the predicted Morse code radio frequency identifier further identifies one of that a Morse radio frequency signal identifier was not detected, and that the detected Morse radio frequency signal identifier does not correspond to the predicted Morse code radio frequency identifier.

29. The decoder recited in claim 28 wherein the detected signal received in the down-sampler quadrature filter bank is an analog radio frequency signal converted to a digital signal.

30. The decoder recited in claim 28, further comprising an analog-to-digital signal converter structured to convert the detected Morse radio frequency signal from an analog signal to a digital signal.

31. The decoder recited in claim 28 wherein the predicted Morse code radio frequency identifier is derived from a database of stored radio frequency identifiers.

32. The decoder recited in claim 28 wherein the viterbi most-likely sequence estimator is further structured to operate a most-likely sequence estimator on outputs of the presence detector as a function of a predetermined state chart.

33. A Morse radio frequency signal identifier decoder, comprising:
  a means for converting a detected Morse radio frequency signal having a coded identifier into an in-phase signal and a quadrature-phase signal and reducing the sampling frequency to a predetermined level;
  a means for filtering the respective in-phase and quadrature signals into a predetermined plurality of filter components and to further reducing the sampling frequency;

a means for searching across the plurality of filter components to predict which of the filter banks contains an identification string of a detected radio signal;

a means for operating a most-likely sequence estimator on outputs of the searching means; and a means for converting a series of 1's and 0's into an estimate of dot, dash, space and word locations in a detected signal;

a means for correlating an output of the estimate of dot, dash, space and word locations in a detected signal with a predicted Morse code radio frequency identifier and determining whether the identifier of a detected Morse radio frequency signal corresponds to the predicted identifier;

a means for determining the signal energy in a detected Morse radio frequency signal identifier relative to a threshold estimate of the signal energy in the predicted Morse code radio frequency identifier; and a means for generating a caution display signal when the signal energy in the detected Morse radio frequency signal identifier does not correlate to the threshold estimate of the signal energy in the predicted Morse code radio frequency identifier.

34. The decoder recited in claim 33, further comprising a means for converting a detected analog Morse radio frequency signal having a coded identifier into a digital signal and outputting the digital signal to the means for converting the signal into an in-phase signal and a quadrature-phase signal and reducing the sampling frequency to a predetermined level.

35. The decoder recited in claim 33, farther comprising a means for deriving the predicted Morse code radio frequency identifier from a database of stored radio frequency identifiers.

36. The decoder recited in claim 33, farther comprising a means for estimating a signal energy in the predicted Morse code radio frequency identifier.

37. A method for decoding an identification string in a Morse coded radio frequency signal, the method comprising:

converting a detected Morse coded radio frequency signal having an identification string into an in-phase signal and a quadrature-phase signal and reducing the sampling frequency to a predetermined level;

filtering the respective in-phase and quadrature signals into a predetermined plurality of filter components and to farther reducing the sampling frequency;

searching across the plurality of filter components and predicting which of the filter banks contains an identification string of a detected radio signal;

operating a most-likely sequence estimator on outputs generated by the searching across the plurality of filter components and predicting which of the filter banks contains an identification string of a detected radio signal; and converting a series of 1's and 0's into an estimate of dot, dash, space and word locations in a detected signal;

correlating the estimate of dot, dash, space and word locations in an identification string of a detected signal with a predicted Morse code radio frequency identification string and determining whether the identification string of a detected signal corresponds to the predicted identification string;

determining the signal energy in a detected identification string relative to a threshold estimate of the signal energy in the predicted identification string; and generating a caution display signal when the signal energy in the detected identification string does not correspond to the threshold estimate of the signal energy in the predicted identification string.

38. The method recited in claim 37, further comprising converting at least an identification string in a detected analog Morse coded radio frequency signal into a digital signal prior to converting the detected radio frequency signal into an in-phase signal and a quadrature-phase signal and reducing the sampling frequency to a predetermined level.

39. The method recited in claim 37, further comprising deriving the predicted identification string from a database of stored identification strings.

40. The method recited in claim 37, further comprising estimating a signal energy in the predicted identification string.

41. The device recited in claim 1, wherein the database and processor are configured to be mobile.

* * * * *